(12) United States Patent
Tanabe (10) Patent No.: US 9,032,123 B2
(45) Date of Patent: May 12, 2015

(54) SERIAL TRANSMISSION DEVICE, METHOD, AND COMPUTER READABLE MEDIUM STORING PROGRAM

(75) Inventor: Yasuhiko Tanabe, Yamanashi (JP)

(73) Assignee: NEC Platforms, Ltd., Tokyo (JP)

( * ) Notice: Subject to any disclaimer, the term of this patent is extended or adjusted under 35 U.S.C. 154(b) by 0 days.

(21) Appl. No.: 13/004,995

(22) Filed: Jan. 12, 2011

(65) Prior Publication Data
US 2011/0191511 A1   Aug. 4, 2011

(30) Foreign Application Priority Data

Feb. 2, 2010   (JP) ................................ 2010-021468

(51) Int. Cl.
G06F 13/12   (2006.01)
G06F 13/38   (2006.01)
G06F 13/20   (2006.01)

(52) U.S. Cl.
CPC ...................................... G06F 13/38 (2013.01)

(58) Field of Classification Search
USPC ........................................ 710/71, 65, 72, 313
See application file for complete search history.

(56) References Cited

U.S. PATENT DOCUMENTS

| | | | | |
|---|---|---|---|---|
| 7,466,668 | B2 * | 12/2008 | Dove | 370/293 |
| 7,477,169 | B2 * | 1/2009 | Carter et al. | 341/59 |
| 7,512,201 | B2 * | 3/2009 | Kelly et al. | 375/356 |
| 7,881,290 | B2 * | 2/2011 | Tanahashi | 370/366 |
| 7,894,537 | B2 * | 2/2011 | Mohiuddin | 375/257 |
| 7,978,802 | B1 * | 7/2011 | Raha et al. | 375/371 |
| 8,161,210 | B1 * | 4/2012 | Norrie | 710/65 |
| 2002/0091885 | A1 * | 7/2002 | Hendrickson et al. | 710/100 |
| 2002/0152340 | A1 * | 10/2002 | Dreps et al. | 710/100 |
| 2006/0195631 | A1 * | 8/2006 | Rajamani | 710/51 |
| 2007/0047667 | A1 * | 3/2007 | Shumarayev | 375/295 |
| 2009/0102581 | A1 * | 4/2009 | Drost et al. | 333/24 C |
| 2009/0240969 | A1 * | 9/2009 | Chiu et al. | 713/401 |
| 2009/0276559 | A1 * | 11/2009 | Allen et al. | 711/5 |

FOREIGN PATENT DOCUMENTS

| | | |
|---|---|---|
| JP | 2009525625 A | 7/2009 |
| WO | 2008/149970 A1 | 12/2008 |

OTHER PUBLICATIONS

Takaaki Moriya et al., "A Study of Reordering Distributed Packets in Multilink Systems", Proceedings of IEICE Society Conference 2, Item No. B-6-109, Sep. 7, 2005, pp. 109, NTT Network Services Systems Laboratories, NTT Corporation. See on p. 2 of translated JP OA for explanation of relevance.

Japanese Office Action for JP Application No. 2010-021468 mailed on Jan. 7, 2014 with English Translation.

* cited by examiner

*Primary Examiner* — Idriss N Alrobaye
*Assistant Examiner* — Getente A Yimer
(74) *Attorney, Agent, or Firm* — Sughrue Mion, PLLC (57) ABSTRACT

A serial transmission device includes a transmitting unit that transmits data, a receiving unit that receives the data, and a plurality of serial transmission paths that connect the transmitting unit with the receiving unit and are used to transmit data. The receiving unit includes an inter-lane skew information generation unit that generates inter-lane skew information about skew of each of the serial transmission paths and transmits the generated inter-lane skew information to the transmitting unit. The transmitting unit includes a data conversion rule generation unit that generates a conversion rule used to determine distribution of the data to each of the serial transmission paths based on the inter-lane skew information.

13 Claims, 8 Drawing Sheets

| # | LANE 0 TRANSMISSION TIME (T) | LANE 1 TRANSMISSION TIME (T) | SKEW DIFFERENCE BETWEEN LANES | TRANSMISSION BIT LANE 0 | TRANSMISSION BIT LANE 1 |
|---|---|---|---|---|---|
| 1 | 1 | 1 | 0 | 0, 2 | 1, 3 |
| 2 | 1 | 2 | 1 | 0, 2 | 1, 3 |
| 3 | 1 | 3 | 2 | 0, 1, 2 | 3 |
| 4 | 1 | 4 | 3 | 0, 1, 2 | 3 |
| 5 | 1 | 5 | 4 | 0, 1, 2, 3 | |
| 6 | 2 | 1 | 1 | 0, 2 | 1, 3 |
| 7 | 3 | 1 | 2 | 3 | 0, 1, 2 |
| 8 | 4 | 1 | 3 | 3 | 0, 1, 2 |
| 9 | 5 | 1 | 4 | | 0, 1, 2, 3 |

Fig. 6

| # | LANE 0 TRANSMISSION TIME (T) | LANE 1 TRANSMISSION TIME (T) | SKEW DIFFERENCE BETWEEN LANES | TRANSMISSION BIT LANE 0 | TRANSMISSION BIT LANE 1 |
|---|---|---|---|---|---|
| 1 | 1 | 1 | 0 | 0,2,4 | 1,3,5 |
| 2 | 1 | 2 | 1 | 0,2,4 | 1,3,5 |
| 3 | 1 | 3 | 2 | 0,1,2,4 | 3,5 |
| 4 | 1 | 4 | 3 | 0,1,2,4 | 3,5 |
| 5 | 1 | 5 | 4 | 0,1,2,3,4 | 5 |
| 6 | 1 | 6 | 5 | 0,1,2,3,4 | 5 |
| 7 | 1 | 7 | 6 | 0,1,2,3,4,5 | |
| 8 | 2 | 1 | 1 | 0,2,4 | 1,3,5 |
| 9 | 3 | 1 | 2 | 3,5 | 0,1,2,4 |
| 10 | 4 | 1 | 3 | 3,5 | 0,1,2,4 |
| 11 | 5 | 1 | 4 | 5 | 0,1,2,3,4 |
| 12 | 6 | 1 | 5 | 5 | 0,1,2,3,4 |
| 13 | 7 | 1 | 6 | | 0,1,2,3,4,5 |

SERIAL TRANSMISSION DEVICE, METHOD, AND COMPUTER READABLE MEDIUM STORING PROGRAM

INCORPORATION BY REFERENCE

This application is based upon and claims the benefit of priority from Japanese patent application No. 2010-021468, filed on Feb. 2, 2010, the disclosure of which is incorporated herein in its entirety by reference.

BACKGROUND

1. Field of the Invention

The present invention relates to a serial transmission technique using a plurality of serial transmission paths.

2. Description of Related Art

Figure 8:
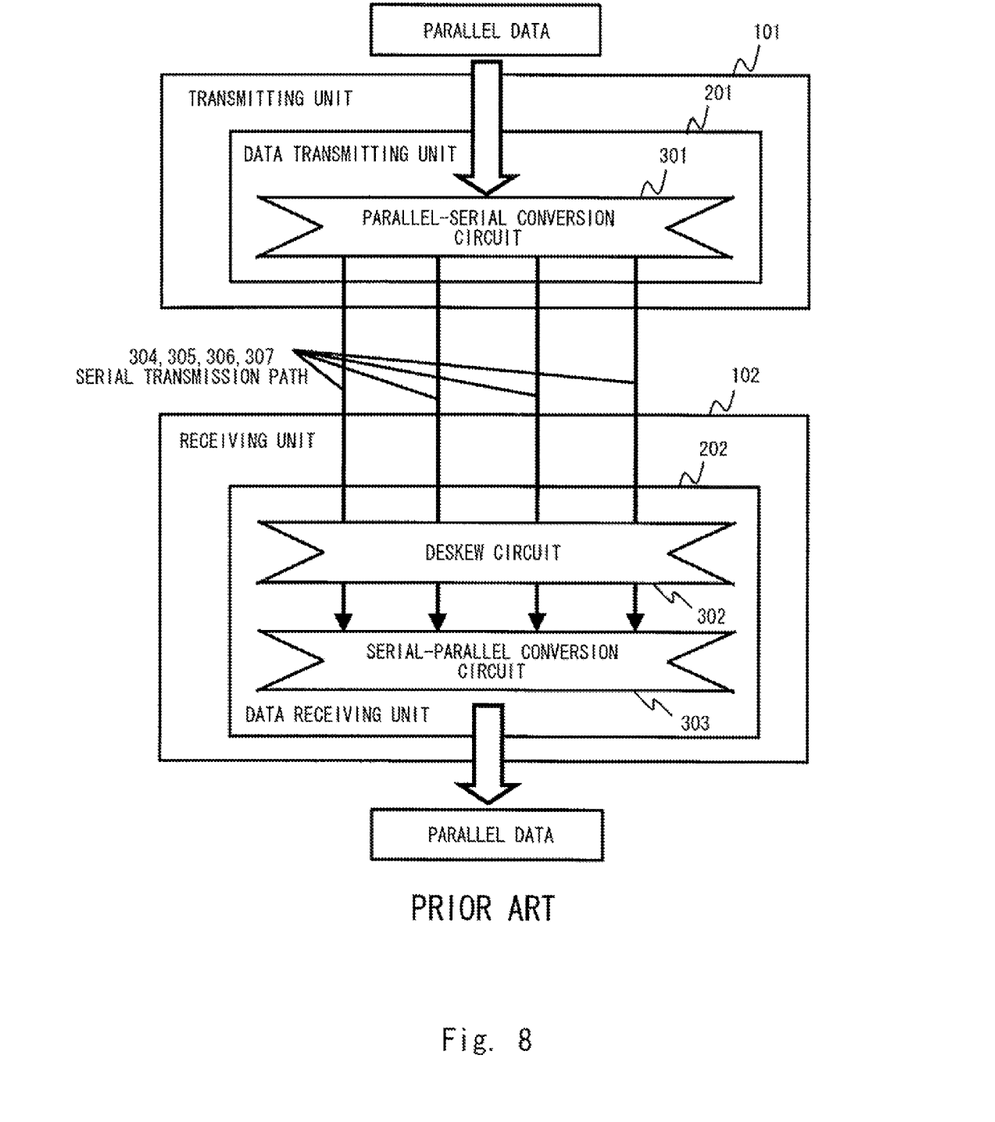
FIG. 8 shows an example of a configuration of a serial interface of a prior art.

As shown in FIG. 8 as an example, a typical serial interface equipped with multiple lanes such as PCI-Express (registered trademark) includes a parallel-serial conversion circuit 301 in the transmitting unit 101, and two or more serial transmission paths 304, 305, 306 and 307 used to transmit converted data. Further, the serial interface also includes a deskew circuit 302 that corrects skew occurring in each of the serial transmission paths 304, 305, 306 and 307 due to the condition and/or the design error of the serial transmission paths 304, 305, 306 and 307 (hereinafter referred to as "inter-lane skew"), and a serial-parallel conversion circuit 303 that converts received serial data into parallel data in the receiving unit 102.

In the serial interface shown in FIG. 8, parallel data is converted into serial data by the parallel-serial conversion circuit 301 of the data transmitting unit 201 in the transmitting unit 101. The converted serial data is transmitted to the receiving unit 102 through the serial transmission paths 304, 305, 306 and 307. After that, the transmitted serial data is corrected for the inter-lane skew by the deskew circuit 302 of the data receiving unit 202. The serial data that is corrected by and output from the deskew circuit 302 is converted into parallel data by the serial-parallel conversion circuit 303 and the converted parallel data is externally output.

As described above, the inter-lane skew occurs between the serial transmission paths 304, 305, 306 and 307, which extend from the transmitting unit 101 to the receiving unit 102. The deskew circuit 302 performs waiting for transmission data in order to correct the transmitted data for the inter-lane skew. This waiting process is necessary to restore the serial data, which was converted by the parallel-serial conversion circuit 301, to the original parallel data by the serial-parallel conversion circuit 303.

Published Japanese Translation of PCT International Publication for Patent Application, No. 2009-525625 discloses an embodiment of a transmission technique using multiple high-speed serial data paths. In this embodiment, packets to be transmitted through each lane is determined based on the inter-lane skew and the size of the packet on the transmission side, and then the determined packets are transmitted through each lane in a full-packet state (in the case of typical serial transmission, packets are divided for each lane and transmitted through each lane). According to the literature, this configuration eliminates the need for the deskew buffer on the reception side.

In the above-described serial interface shown in FIG. 8, the countermeasures against the inter-lane skew, which occurs when data is transmitted from the transmitting unit 101 to the receiving unit 102, are taken only on the receiving unit 101 side. Therefore, the waiting needs to be performed until all the data are received on the receiving unit 102 side, thus causing a problem that the latency, which is determined by the lane having the largest inter-lane skew, increases.

The embodiment disclosed in Published Japanese Translation of PCT International Publication for Patent Application, No. 2009-525625 also cannot solve the above-described problem regarding the increase in latency.

SUMMARY

Accordingly, an exemplary object of the present invention is to reduce the waiting time for data on the reception side, and thereby reducing the latency occurring between the transmission side and the reception side.

A first exemplary aspect of the present invention is a serial transmission device including: a transmitting unit that transmits data; a receiving unit that receives the data; a plurality of serial transmission paths that connect the transmitting unit with the receiving unit, and are used to transmit the data; an inter-lane skew information generation unit that generates inter-lane skew information about skew of each of the serial transmission paths in the receiving unit, and transmits the generated inter-lane skew information to the transmitting unit; and a data conversion rule generation unit that generates a conversion rule used to determine distribution of the data to each of the serial transmission paths based on the inter-lane skew information in the transmitting unit.

A second exemplary aspect of the present invention is a serial transmission method including: transmitting inter-lane skew information about skew of a plurality of serial transmission paths obtained on a reception side to a transmission side; and determining distribution of data to each of the serial transmission paths, based on the transmitted inter-lane skew information on the transmission side.

A third exemplary aspect of the present invention is a computer readable medium storing a program used to control an apparatus that transmits data from a transmitting unit to a receiving unit through a plurality of serial transmission paths, wherein the program causes the apparatus to: transmit inter-lane skew information about skew of each of the serial transmission paths obtained in the receiving unit to the transmitting unit; and determines distribution of data to each of the serial transmission paths based on the transmitted inter-lane skew information in the transmitting unit.

In accordance with the above-described exemplary aspects of the present invention, the inter-lane skew information is transmitted from the receiving unit to the transmitting unit. In the transmitting unit, the conversion rule is generated based on the inter-lane skew information and the distribution of data to each of the serial transmission paths is determined based on the conversion rule. In other words, the data frame format is optimized on the transmission side based on the inter-lane skew information obtained on the reception side. In this way, it is possible to reduce the waiting time for data on the reception side, and thereby reducing the latency occurring between the transmission side and the reception side.

BRIEF DESCRIPTION OF THE DRAWINGS

The above and other aspects, features, and advantages of the present invention will become more apparent from the following description of certain exemplary embodiments when taken in conjunction with the accompanying drawings, in which.

EXEMPLARY EMBODIMENTS

First Exemplary Embodiment

Figure 1:
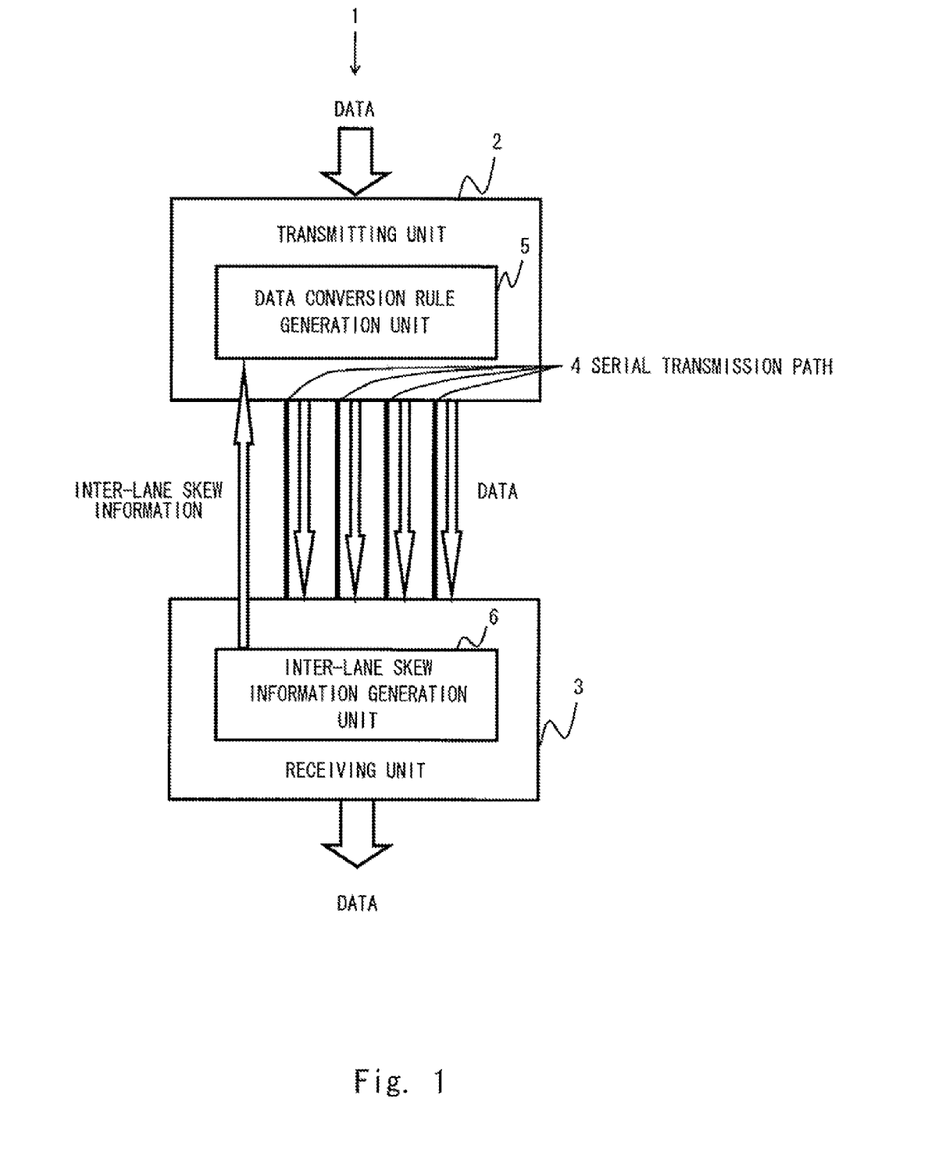
FIG. 1 shows a functional configuration of a serial transmission device in accordance with a first exemplary embodiment of the present invention.

Exemplary embodiments in accordance with the present invention are explained hereinafter with reference to the drawings. FIG. 1 shows a functional configuration of a serial transmission device 1 in accordance with a first exemplary embodiment of the present invention. The serial transmission device 1 includes a transmitting unit 2 that transmits data, a receiving unit 3 that receives the data, and a plurality of serial transmission paths 4 that connect the transmitting unit 2 with the receiving unit 3 and are used to transmit the data. The receiving unit 3 includes an inter-lane skew information generation unit 6 that generates inter-lane skew information about skew of each of the serial transmission paths 4 and transmits the generated inter-lane skew information to the transmitting unit 2. The transmitting unit 2 includes a data conversion rule generation unit 5 that generates a conversion rule used to determine distribution of the data to each of the serial transmission paths 4 based on the inter-lane skew information.

In the above-described configuration, the inter-lane skew information is transmitted from the receiving unit 3 to the transmitting unit 2. Then, the conversion rule is generated based on the skew information in the data conversion rule generation unit 5, and the distribution of data to each of the serial transmission paths 4 is determined based on the conversion rule.

Figure 2:
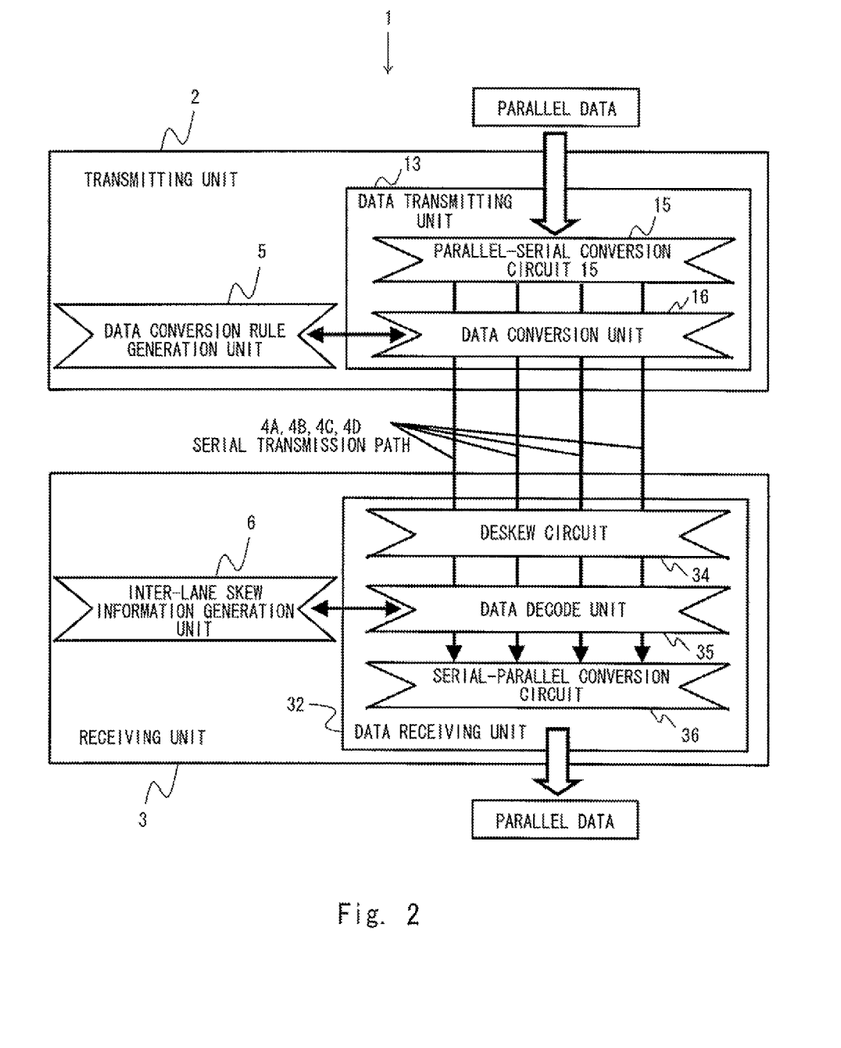
FIG. 2 shows an example of a specific configuration of a serial transmission device in accordance with a first exemplary embodiment of the present invention.

FIG. 2 shows an example of a specific configuration of the serial transmission device 1. The transmitting unit 2 includes the data conversion rule generation unit 5 that determines the conversion rule used to change the data frame format for the plurality of lanes, i.e., for each of the serial transmission paths 4A, 4B, 4C and 4D by taking the inter-lane skew into consideration. Further, the transmitting unit 2 also includes a data transmitting unit 13. The data transmitting unit 13 includes a parallel-serial conversion circuit 15 that converts parallel data into serial data, and a data conversion unit 16 that performs data conversion on the serial data based on a rule notified from the data conversion rule generation unit 5.

The serial data converted by the data conversion unit 16 of the transmitting unit 2 is transmitted to the receiving unit 3 through the serial transmission paths 4A, 4B, 4C and 4D. Although the number of the serial transmission paths 4A, 4B, 4C and 4D is four in this exemplary embodiment, the present invention is not limited to this number. That is, the present invention can be applied to any serial transmission device including at least two serial transmission paths.

The receiving unit 3 includes the inter-lane skew information generation unit 6, which generates the inter-lane skew information and notifies the generated inter-lane skew information to the transmitting unit 2. Further, the receiving unit 3 also includes a data receiving unit 32. The data receiving unit 32 includes a deskew circuit 34 that corrects received serial data for the inter-lane skew, a data decode unit 35 that restores the data, which was changed into a frame format in the data conversion unit 16, to the original format, and a serial-parallel conversion circuit 36 that converts serial data into parallel data.

Figure 3:
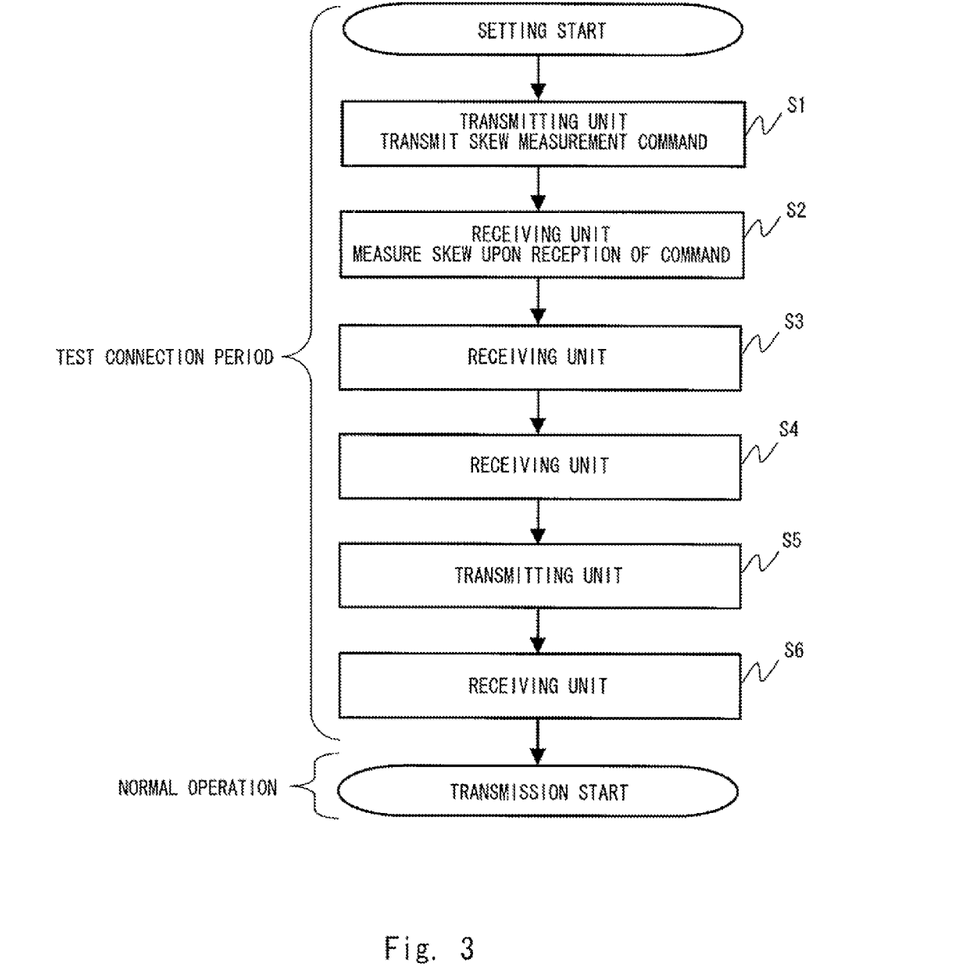
FIG. 3 is a flowchart showing an operation of the serial transmission device shown in FIG. 2.

FIG. 3 shows an operation of the serial transmission device 1 having the above-described configuration. The data frame format rule and the data decode rule are set by the exchange of training information performed when a link is established between the transmitting unit 2 and the receiving unit 3 in a serial-link establishment phase. The frame format rule is defined by taking the inter-lane skew into consideration.

The transmitting unit 2 transmits a command instructing the receiving unit 3 to measure the inter-lane skew in order to measure the inter-lane skew during a test connection, which is commonly carried out in the serial transmission device (S1). Upon receiving the command, the receiving unit 3 measures the inter-lane skew based on the command arrival time in each lane (S2).

The inter-lane skew information generation unit 6 of the receiving unit 3 generates information about the measured inter-lane skew (S3). The information to be generated is preferably time differences or the like based on the arrival time in the lane through which die command has arrived earlier than those arriving through any other lanes. The inter-lane skew information generation unit 6 notifies the obtained inter-lane skew information to the data conversion rule generation unit 5 of the transmitting unit 2 through the serial transmission paths 4A, 4B, 4C and 4D (S4). The data conversion rule generation unit 5 determines the data conversion rule based on the notified inter-lane skew information, and sets the determined data conversion rule in the data conversion unit 16 of the data transmitting unit 13. The data conversion rule generation unit 5 also notifies the data conversion rule to the data decode unit 35 of the receiving unit 3 through the serial transmission paths 4A, 4B, 4C and 4D. The data decode unit 35 sets the decode rule for serial data that will be transmitted from the transmitting unit 2 (S6). After the above-described operation is carried out, actual data transmission is started.

Next, an operation of the data conversion rule generation unit 5 (S5) is explained. The data conversion rule generation unit 5 generates a transmission order change rule in such a manner that a larger amount of data is transmitted through a lane capable of transmitting data more swiftly (the serial transmission path 4A, 4B, 4C or 4D) based on the inter-lane skew information so that all the data can arrive at the receiving unit 3 more quickly.

Figure 4:
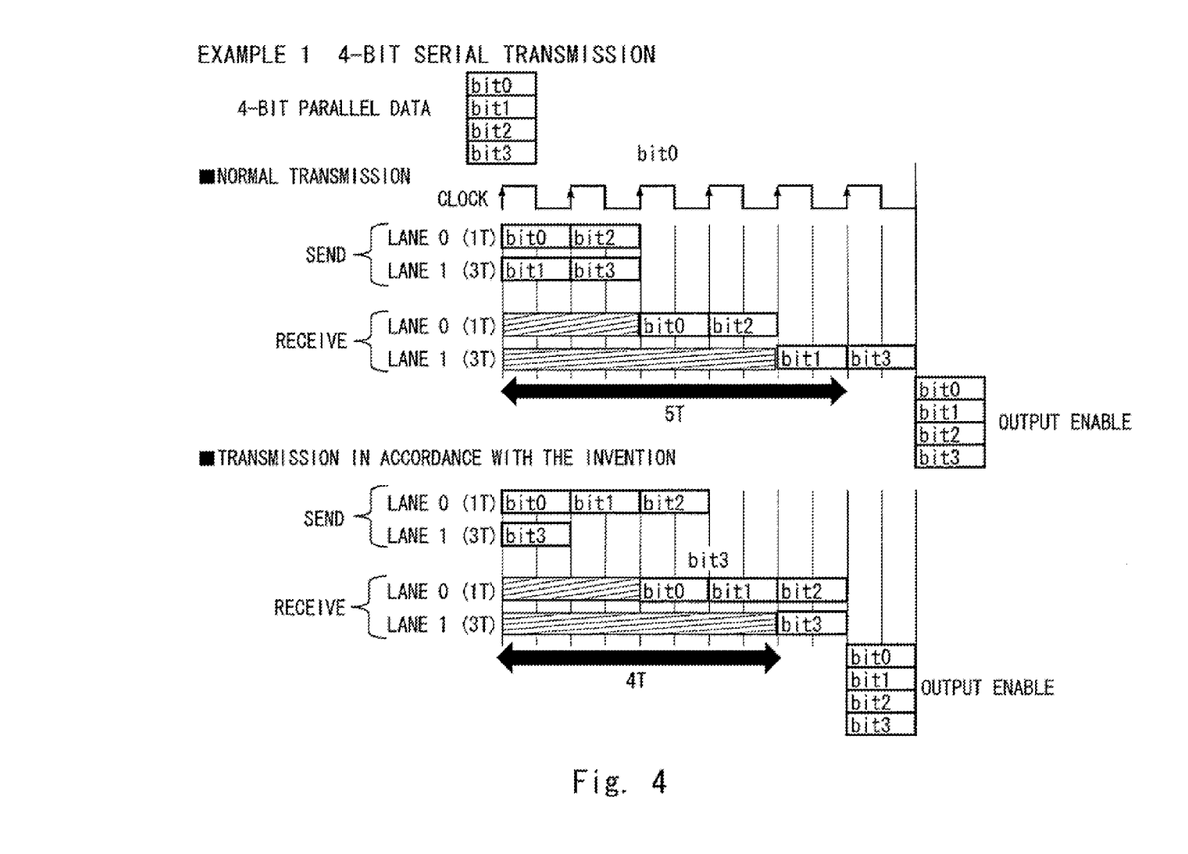
FIG. 4 shows an example of first transmission by a serial transmission device in accordance with a first exemplary embodiment of the present invention.
Figure 6:
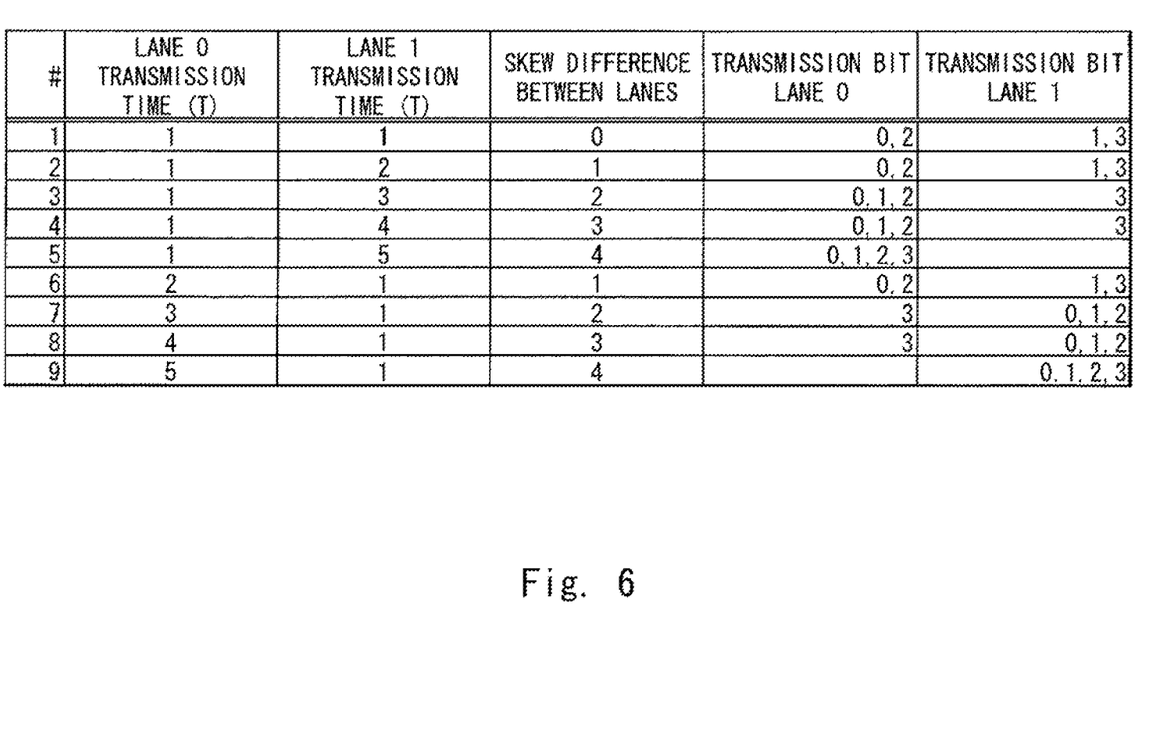
FIG. 6 is a table showing an example of n data conversion rule corresponding to the first transmission example.

Two examples of transmission are explained hereinafter. The data used in these examples is handled in units of bit, and the number of lanes is two. Firstly, in Example 1 shown in FIG. 4, a case where the latency is reduced by 1 T by applying a conversion rule shown in FIG. 6 is explained. In Example 1, the transmission data consists of four bits. Further, the lanes 0 and 1 have skew of 1 T and 3 T respectively, and therefore the difference in skew between these lances is 2 T. Therefore, the third rule in the table shown in FIG. 6 is applied as the conversion rule. In this case, all the data are received on RECEIVE side in 5T after the transmission start in the normal transmission. Then after that, 4-bit parallel data can be output. By contrast, in this exemplary embodiment in accordance with the present invention, the bits 0, 1 and 2 are transmitted through the lane 0 having smaller skew, while the bit 3 is transmitted through the lane 1. In this way, all the data are received on RECEIVE side in 4 T after the transmission start. That is, the latency is improved by 1 T.

Figure 5:
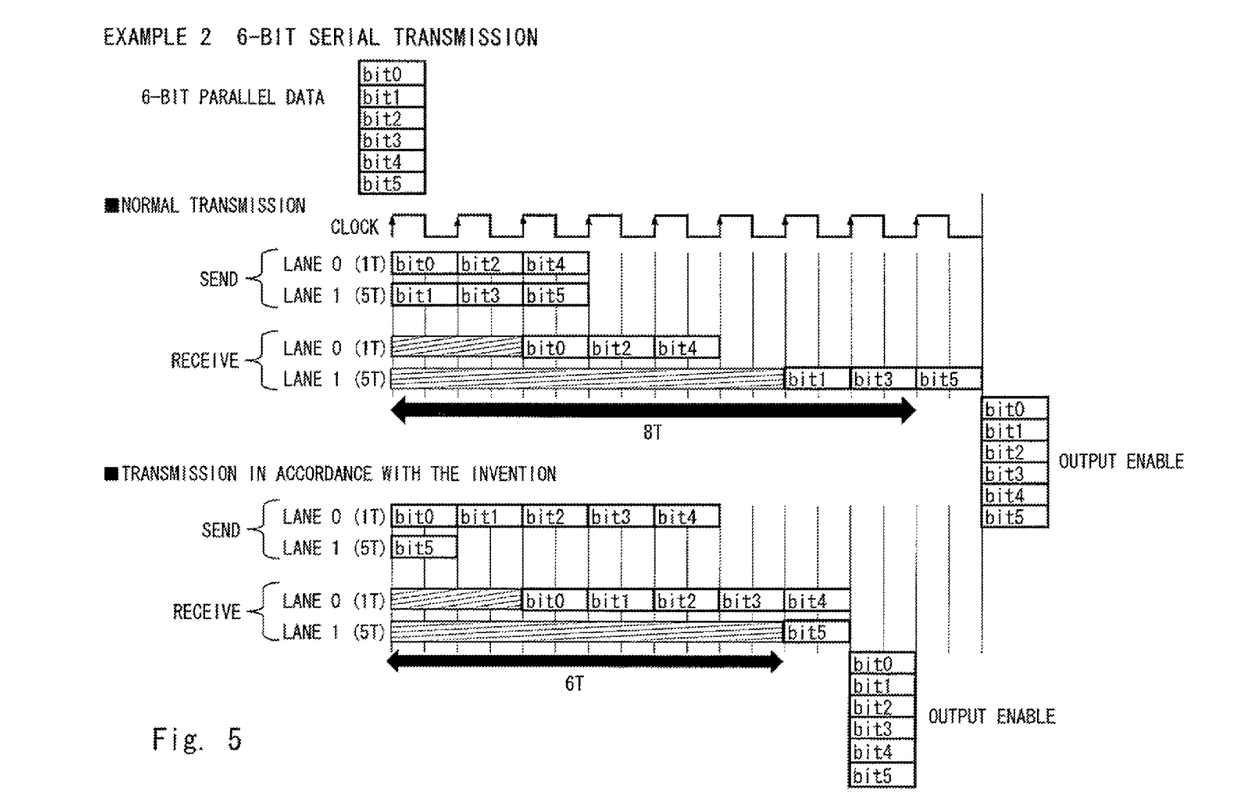
FIG. 5 shows an example of second transmission by a serial transmission device in accordance with a first exemplary embodiment of the present invention.
Figure 7:
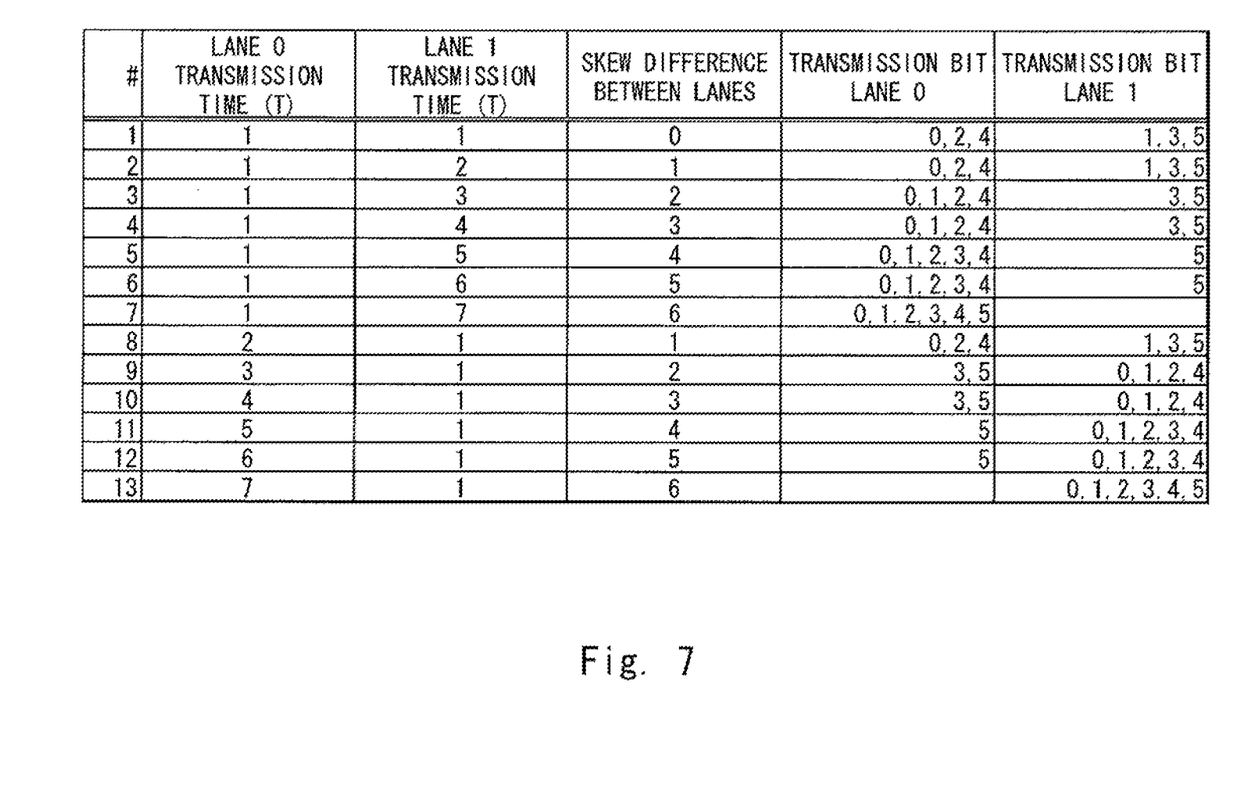
FIG. 7 is a table showing an example of a data conversion rule corresponding to the second transmission example.

Next, in Example 2 shown in FIG. 5, a case where the latency is reduced by 2 T by applying a conversion rule shown in FIG. 7 is explained. In Example 2, the transmission data consists of six bits. Further, the lanes 0 and 1 have skew of 1 T and 5 T respectively, and therefore the difference in skew between these lances is 4 T. Therefore, the fifth rule in the table shown in FIG. 7 is applied as the conversion rule. In this case, all the data are received on RECEIVE side in 8 T after the transmission start in the normal transmission. Then after that, 8-bit parallel data can be output. By contrast, in this exemplary embodiment in accordance with the present invention, the bits 0, 1, 2, 3 and 4 are transmitted through the lane 0 having smaller skew, while the bit 5 is transmitted through the lane 1. In this way, all the data are received on RECEIVE side in 6 T after the transmission start. That is, the latency is improved by 2 T. Note that the above-described operation may be implemented, for example, by using a computer in which the data conversion rule generation unit 5, the inter-lane skew information generation unit 6, the data conversion unit 16, and the like are controlled by a program(s).

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

As has been described so far, in the serial transmission device 1 in accordance with the first exemplary embodiment of the present invention, the inter-lane skew information is transmitted from the receiving unit 3 to the transmitting unit 2 as link training information. Then, the data transmission order and the lanes to be used are changed based on the inter-lane skew information in the transmitting unit 2 in order to optimize the data frame format. As a result, the waiting time in the receiving unit 3 can be reduced, and therefore the latency can be also reduced.

While the invention has been particularly shown and described with reference to the exemplary embodiment thereof, the invention is not limited to these embodiments. It will be understood by those of ordinary skill in the art that various changes in form and details may be made therein without departing from the spirit and scope of the present invention as defined by the claims.

What is claimed is:
1. A serial transmission device comprising:
a transmitting unit that transmits data;
a receiving unit that receives the data; and
a plurality of serial transmission paths that connect the transmitting unit with the receiving unit, and are used to transmit the data from the transmitting unit to the receiving unit, wherein
the receiving unit includes an inter-lane skew information generation unit that generates inter-lane skew information about skew of each of the serial transmission paths in the receiving unit, and transmits the generated inter-lane skew information to the transmitting unit,
the transmitting unit includes a data conversion rule generation unit that generates a conversion rule used to determine distribution of the data to each of the serial transmission paths based on the inter-lane skew information in the transmitting unit, wherein
the receiving unit measures arrival times of commands each transmitted through a respective one of the plurality of serial transmission paths,
the inter-lane skew information generation unit generates differences each between an earliest arrival time among the measured arrival times of the serial transmission paths and each of the arrival times of the serial transmission paths as the inter-lane skew information,
the receiving unit transmits the generated inter-lane skew information, and
the data conversion rule generation unit generates the conversion rule based on the inter-lane skew information so that a larger amount of data is transmitted through a serial transmission path capable of transmitting data more quickly among the serial transmission paths, wherein the transmitting unit comprises:
the data conversion rule generation unit;
a parallel-serial conversion circuit that converts parallel data into serial data; and
a data conversion unit that distributes serial data converted by the parallel-serial conversion circuit to each of the serial transmission paths in accordance with the conversion rule, and
the receiving unit comprises:
the inter-lane skew information generation unit;
a deskew circuit that performs waiting for each serial data input through each of the serial transmission paths;
a data decode unit that performs decode processing on serial data obtained through the deskew circuit based on the conversion rule; and
a serial-parallel conversion circuit that converts the serial data into parallel data.

2. The serial transmission device according to claim 1, wherein the inter-lane skew information is transmitted through the serial transmission path.

3. The serial transmission device according to claim 2, wherein the inter-lane skew information is transmitted as link training information.

4. The serial transmission device according to claim 1, wherein the conversion rule is transmitted through the serial transmission path.

5. A serial transmission method comprising:
measuring arrival times of commands at a reception side, each of the commands being transmitted from a transmission side through a respective one of a plurality of serial transmission paths;
generating inter-lane skew information for each of the serial transmission paths at the reception side, the inter-lane skew information being a difference between an earliest arrival time among the measured arrival times of the serial transmission paths and a respective one of the arrival times of the serial transmission paths;

transmitting the generated inter-lane skew information of the plurality of serial transmission paths from the reception side to the transmission side; and determining distribution of data to each of the serial transmission paths based on the transmitted inter-lane skew information on the transmission side so that a larger amount of data is transmitted through a serial transmission path capable of transmitting data more quickly among the serial transmission paths, wherein the method further comprises:

converting parallel data into serial data;

distributing the serial data to each of the serial transmission paths in accordance with a conversion rule;

performing waiting for each serial data input through each of the serial transmission paths;

performing decode processing on serial data based on the conversion rule; and converting the serial data into parallel data.

6. The serial transmission method according to claim 5, further comprising:

transmitting a conversion rule used to determine distribution of the data from the transmission side to the reception side; and restoring received data to an original state before the distribution based on the conversion rule on the reception side.

7. The serial transmission method according to claim 5, wherein the inter-lane skew information is transmitted as link training information.

8. The serial transmission method according to claim 5, further comprising:

converting parallel data into serial data on the reception side; and converting serial data into parallel data on the transmission side.

9. A non-transitory computer readable medium storing a serial transmission program used to control an apparatus that transmits data from a transmitting unit to a receiving unit through a plurality of serial transmission paths, wherein the program causes the apparatus to:

measure arrival times of commands at a reception side, each of the commands being transmitted from a transmission side through a respective one of a plurality of serial transmission paths;

generate inter-lane skew information for each of the serial transmission paths at the reception side, the inter-lane skew information being a difference between an earliest arrival time among the measured arrival times of the serial transmission paths and a respective one of the arrival times of the serial transmission paths;

transmit the generated inter-lane skew information of the plurality of serial transmission paths from the reception side to the transmission unit; and determines distribution of data to each of the serial transmission paths based on the transmitted inter-lane skew information in the transmitting unit so that a larger amount of data is transmitted through a serial transmission path capable of transmitting data more quickly among the serial transmission paths, wherein the program further causes the apparatus to:

convert parallel data into serial data;

distribute the serial data to each of the serial transmission paths in accordance with a conversion rule;

perform waiting for each serial data input through each of the serial transmission paths;

perform decode processing on serial data based on the conversion rule; and convert the serial data into parallel data.

10. The serial transmission device according to claim 1, wherein the transmitting unit optimizes a data frame format based on the inter-lane skew information transmitted from the receiving unit.

11. The serial transmission device according to claim 1, wherein the transmitting unit distributes the data to each of the serial transmission paths in such a manner that an amount of data transmitted within a fixed time period decreases with increase of skew of the serial transmission paths.

12. The serial transmission method according to claim 5, wherein a data frame format is optimized on the transmission side based on the inter-lane skew information transmitted from the reception side.

13. The serial transmission method according to claim 5, wherein the data is distributed to each of the serial transmission paths on the transmission side in such a manner that an amount of data transmitted within a fixed time period decreases with increase of skew of the serial transmission paths.

* * * * *